United States Patent [19]

Lin

[11] Patent Number: 5,621,244

[45] Date of Patent: Apr. 15, 1997

[54] FIN ASSEMBLY FOR AN INTEGRATED CIRCUIT

[76] Inventor: Shih-jen Lin, No. 360, Tanan Rd., Taipei, Taiwan

[21] Appl. No.: 515,942

[22] Filed: Aug. 16, 1995

Related U.S. Application Data

[63] Continuation-in-part of Ser. No. 243,464, May 16, 1994, abandoned.

[51] Int. Cl.$^6$ .................................................. H01L 23/34
[52] U.S. Cl. ........................... 257/713; 257/718; 257/722; 257/726; 257/727
[58] Field of Search ...................................... 257/713, 718, 257/719, 722, 726, 727

[56] References Cited

U.S. PATENT DOCUMENTS

| | | | |
|---|---|---|---|
| 4,552,206 | 11/1985 | Johnson et al. | 257/713 |
| 4,878,108 | 10/1989 | Phelps, Jr. et al. | 257/718 |
| 5,280,409 | 1/1994 | Selna et al. | 257/718 |
| 5,304,735 | 4/1994 | Earl et al. | 257/718 |
| 5,307,929 | 5/1994 | Seidler | 257/666 |
| 5,371,652 | 12/1994 | Clemens et al. | 257/727 |
| 5,396,402 | 3/1995 | Perugini et al. | 257/718 |
| 5,475,564 | 12/1995 | Chiou | 257/727 |

*Primary Examiner*—Mahshid Saadat
*Assistant Examiner*—Jhihan Clark
*Attorney, Agent, or Firm*—Calvin B. Ward

[57] ABSTRACT

A fin assembly for dissipating heat generated by an integrated circuit chip mounted on a socket having a pair of positioning ears disposed at two opposite sides thereof is disclosed. The fin assembly includes a fin and a pair of substantially L-shaped fastening members. The fin includes a bottom surface for contacting an integrated circuit chip and an upper surface from which a plurality of ridges extend upward along a length direction thereof. Each two adjacent said ridges define a channel therebetween and in one of the channels, at least one of two associated adjacent ridges has one extension extending toward the other ridge thereby defining a compartment having two opposite ends. Each of the fastening members comprises a first limb and a second limb. The first limb has a springing section formed adjacent to a joint of the first and second limbs and a flexible biasing section projecting from a free end thereof and extending toward said second limb. The biasing section of respective first limb is inserted into said compartment from the two opposite ends respectively and the biasing section has a height slightly greater than a height of said compartment. The second limb has an engaging slot defined therein adjacent to an arcuate free end thereof for cooperating with one of the positioning ears to thereby detachably lock the fin to the socket to ensure reliable surface contact between the integrated circuit chip and the fin.

5 Claims, 3 Drawing Sheets

FIN ASSEMBLY FOR AN INTEGRATED CIRCUIT

This is a Continuation in Part application of the application Ser. No. 08/243,464, filed on May 16, 1994, now abandoned.

BACKGROUND OF THE INVENTION

1. Field of the Invention

The present invention relates to a fin assembly for an integrated circuit and, more particularly, to a fin assembly for an integrated circuit which is mounted to a newly developed Zero Insertion Force (ZIF) Socket.

2. Description of Related Art

Presently, an integrated circuit, especially a central processing unit (CPU) is detachably mounted to a newly developed Zero Insertion Force (ZIF) Socket, which, in turn, is mounted on a printed circuit board to ensure reliable electrical connection between the CPU and the printed circuit board. It is well known to provide a cooling device, including a fin device and/or a fan, to reduce the working temperature of the CPU to prevent damage thereto. However, the prior art cooling device for the CPU mounted on a ZIF socket still has some drawbacks as follows: (1) the mounting and detachment of the cooling device is troublesome; (2) the hook-like fasteners of the cooling device are generally made of plastic and thus tend to suffer from elastic fatigue and are fragile due to hardening under high temperature environment; (3) the CPU, after assembly, is raised by the cooling device and thus sometimes causes bad electrical connection with the printed circuit board; and (4) since the hook-like fasteners are less elastic, the fin cannot have effective surface contact with the CPU if the CPU is too thin, and sometimes it is impossible to assemble the fin to the CPU if the fin and/or the CPU is too thick. Therefore, there has been a long and unfulfilled need for an improved fin assembly to mitigate and/or obviate the aforementioned drawbacks.

SUMMARY OF THE INVENTION

The present invention provides a fin assembly to be used with a ZIF socket which has a pair of positioning ears and each of the positioning ears has an inclined upper surface and is disposed at two opposite sides of the socket respectively.

The fin assembly comprises a fin and a pair of fastening members. The fin includes a bottom surface for contacting an upper surface of an integrated circuit chip and an upper surface from which a plurality of ridges extend upward along a length direction thereof. Each two adjacent said ridges define a channel therebetween, in at least one of the channels, at least one of two associated adjacent said ridges having one extension extending toward the other ridge thereby defining a compartment, the compartment having two opposite ends.

Each of the pair of the fastening members is substantially L-shaped and comprises a first limb and a second limb for detachably fastening the fin onto an integrated circuit chip. The first limb has a springing section formed adjacent to a joint of the first and second limbs and a flexible biasing section projecting from a free end thereof and extending toward said second limb. The biasing section of respective first limb is inserted into the compartment from the two opposite ends respectively and the biasing section has a height slightly greater than a height of said compartment. The second limb has an engaging slot formed therein adjacent to a free end thereof for cooperating with one of the positioning ears to thereby detachably lock the fin to the socket to ensure reliable surface contact between the integrated circuit and said fin.

In accordance with one aspect of the present invention, the flexible biasing section has a distal end being slightly bent downward, and said upper surface of said fin has a recess in said compartment for receiving said distal end of said biasing section of each of said fastening members.

In accordance with another aspect of the present invention, the second limb of each of the fastening members is arcuated outward at the free end thereof to facilitate locking of the engaging slot and the corresponding positioning ear.

In accordance with a further aspect of the present invention, the second limb of each one of the fastening members further comprises an arcuated tongue downwardly and outwardly extending from an upper edge defining the engaging slot for cooperating with an inclined upper face of one of the positioning ears to facilitate unlocking of the engaging slot and the positioning ear.

In accordance with another aspect of the present invention, the springing section of the first limb is a portion of the first limb that inclines from the joint of the First and the second limbs and the height of the second limb is greater than a distance between the upper surface of the fin and the level of the positioning ear.

Other objects, advantages, and novel features of the invention will become more apparent from the following detailed description when taken in conjunction with the accompanying drawings.

DESCRIPTION OF THE PREFERRED EMBODIMENTS

Figure 5:
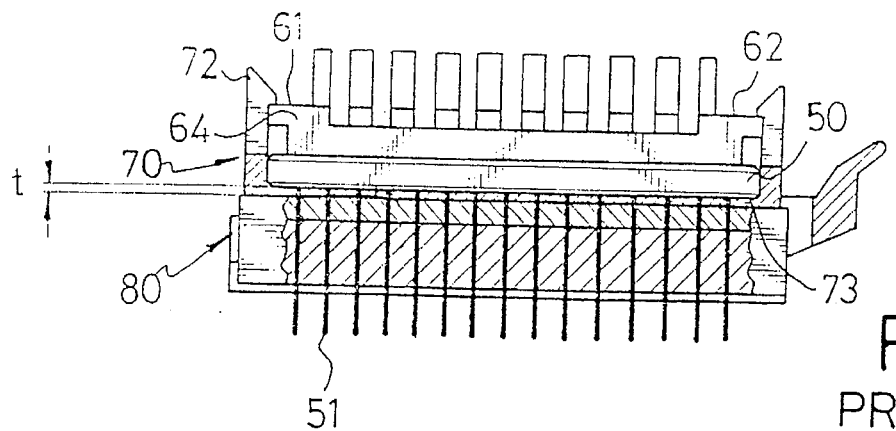
FIG. 5 is a cross-sectional view of the CPU, CPU socket, and the conventional cooling device in FIG. 4.
Figure 4:
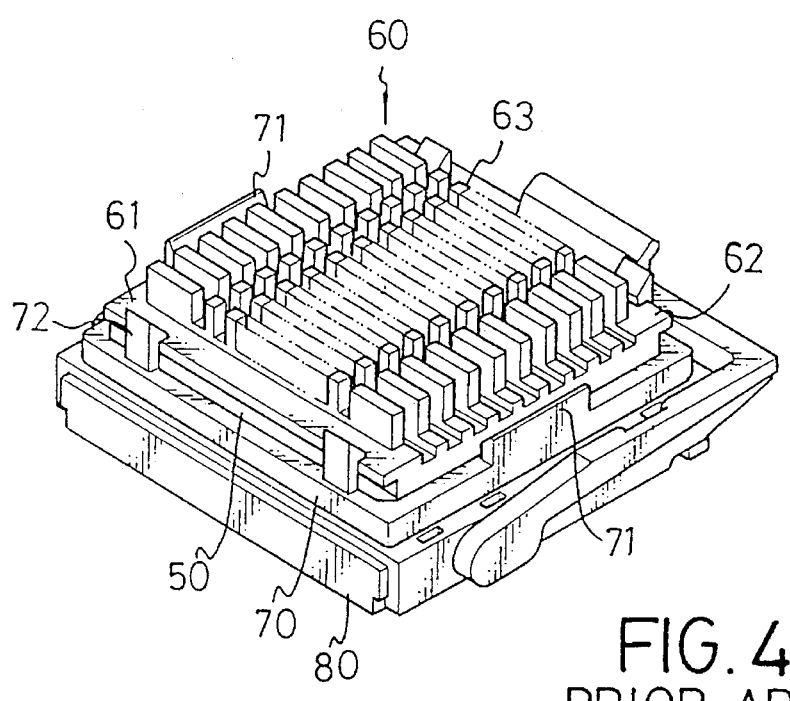
FIG. 4 is a perspective view illustrating a CPU, a CPU socket, and a conventional cooling device for the CPU.

For a better understanding of the background of the invention, reference is firstly made to FIGS. 4 and 5 in which a central processing unit 50 is mounted in a Zero Insertion Force (ZIF) Socket 80, which, in turn, is mounted to a printed circuit board (not shown) which is conventional and will not be further described herein as being less concerned with the present invention. A conventional cooling device, including a fin 60 and a clamping frame 70, is utilized to reduce the temperature of the CPU during operation.

The fin 60 includes a bottom surface for contacting an upper surface of the CPU 50 and an upper surface from which a plurality of spaced ridges 63 extend. The fin 60 also includes two substantially stepped sides 64 each with a smooth upper surface 61, 62. The clamping frame 70 includes a restrainer 71 on each of two opposite sides thereof and a pair of hook-like fasteners 72 on each of the other two opposite sides thereof. For mounting the cooling device to the CPU 50, the latter is firstly detached from the ZIF socket 80 and is then held between a perforated-bottom wall 73 of the clamping frame 70 and the fin 60 by means of the hook-like fasteners 72 engaging with the smooth surfaces 61 and 62. Thereafter, the assembled CPU/cooling device is mounted to the ZIF socket 80 by inserting pins 51 of the CPU into corresponding insertion apertures (not shown in FIGS. 4 and 5) of the socket 80.

It is, however, found that the conventional cooling device has several drawbacks as follows:

(1) The CPU 50, after assembly, is raised by a height (the thickness t of the bottom wall 73 of the clamping frame 70, see FIG. 5), which may cause bad connection and sometimes even disconnection with the printed circuit board. This problem is aggravated as the length of the pins of the CPU today has become shorter than before (the length of the pins of a 80386 CPU is 4.2 mm, while the length of the pins of a 80586 CPU is only 3.05 mm);

(2) The clamping frame 70 is generally made of rigid plastic, which means that the hook-like fasteners 72 thereof are apt to break if too thin and are less elastic if too thick. Furthermore, the whole clamping frame 70 is useless if the hook-like fasteners 72 thereof break. Moreover, the rigid plastic tends to become fragile after a long term use under high temperature working environment caused by the CPU 50;

(3) The CPU 50 has to be detached from the socket 80 before mounting the cooling device and then reassembled to the socket 80 thereafter, which is very inconvenient; and (4) Since the clamping frame 70 is made of plastic which is insufficiently elastic, if the CPU has a thickness less than the pre-determined space defined between the bottom wall 73 of the clamping member 70 and the fin 60 (this may happen during manufacturing), the fin 60 shall not have effective surface contact with the CPU 50 and thus have an inefficient heat dissipation. To the contrary, if the CPU and/or the fin 60 is too thick, assembly of the fin 60 to the CPU becomes impossible.

The present invention is intended to mitigate and/or obviate the above-mentioned drawbacks.

Figure 1:
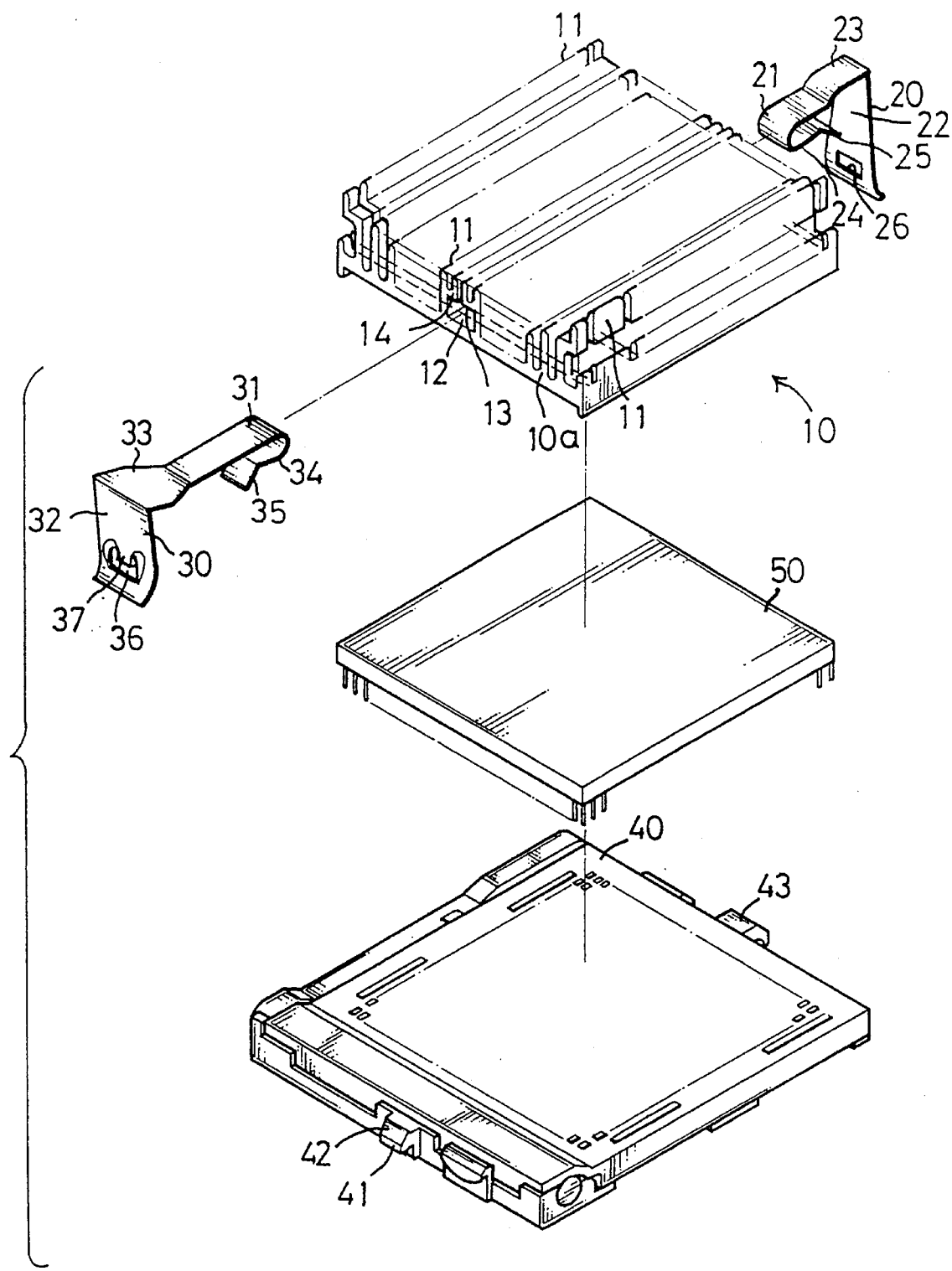
FIG. 1 is an exploded perspective view of a central processing unit (CPU), a socket for the CPU, and a fin assembly for the CPU in accordance with the present invention.
Figure 2:
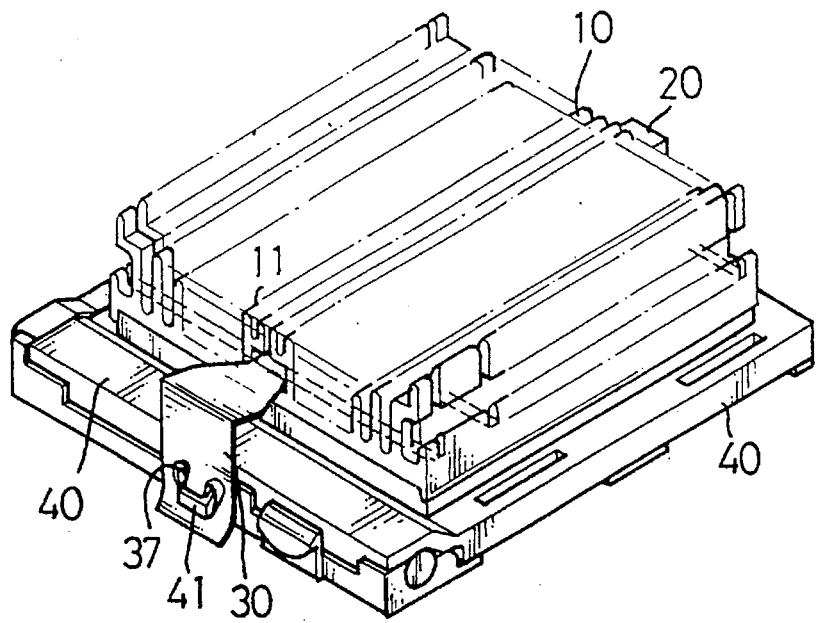
FIG. 2 is a perspective view of the CPU, the socket, and the fin assembly in an assembled status.
Figure 3:
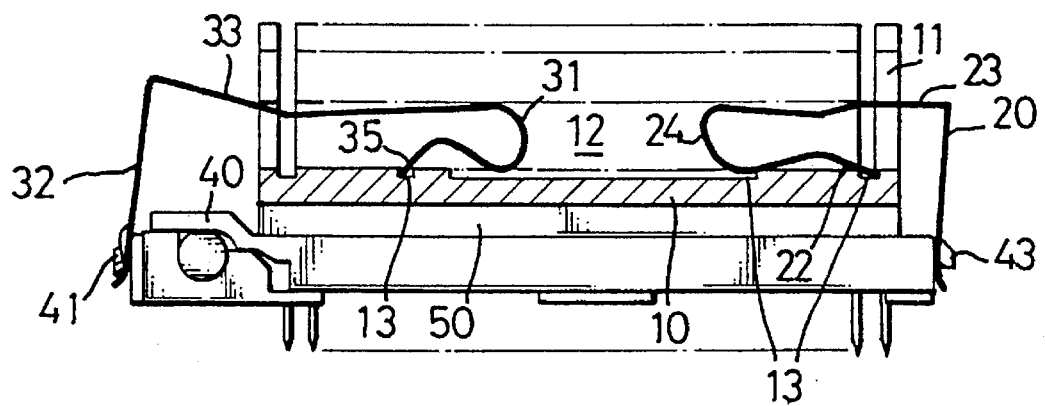
FIG. 3 is a cross-sectional view of the CPU, the socket, and the fin assembly shown in FIG. 2.

Referring now to FIGS. 1 through 3, a fin assembly 10 in accordance with the present invention is constructed to be used with a socket 40 having a pair of positioning ears 41, 43 disposed at two opposite sides thereof respectively. The fin assembly 10 is preferably formed by aluminum extrusion and generally includes a fin 10a which, in turn, includes a bottom surface for contacting an upper surface of a CPU 50 and an upper surface from which a plurality of spaced ridges 11 extend upward along a length direction thereof, each two adjacent ridges 11 defining a channel therebetween. In at least one of the channels, a compartment 12 is defined by a pair of extensions 14 respectively extending from two mutually facing walls of the associated ridges 11. In the present case, the compartment 12 is formed in a channel that aligns with the positioning ears 41 when the fin assembly 10 is fastened onto the CPU 50.

The fin assembly 10 further includes a first fastening member 20 and a second fastening member 30. Each of the fastening members 20, 30 is a substantially L-shaped metallic member including a first limb 21, 31 and a second limb 22, 32 respectively. The first limb 31 of the second fastening member 30 includes a springing section 33 formed adjacent to a joint of the first limb 31 and the second limb 32, and a 19 substantially Z-shaped flexible biasing section 34 projecting from a distal end thereof and extending toward the second limb 32. Preferably, a free end 35 of the Z-shaped flexible biasing section 34 is slightly bent downward.

The second limb 32 of the second fastening member 30 includes an engaging slot 36 defined therein adjacent to a free end thereof. Preferably, the free end 35 of the second limb 32 is curved outward to facilitate locking with the positioning ear 41 and an arcuated tongue 37 downwardly and outwardly extending from an upper edge defining the engaging slot 36 to facilitate unlocking the second fastening member 30 from the positioning ear 41. A part of limb 31 together with the Z-shaped section 34 are inserted into an associated compartment 12 from one end thereof, and the Z-shaped section 34 has a height slightly greater than the height of the compartment 12.

The first fastening member 20 has a structure similar to that of the second fastening member 30 as described hereinbefore except there is no arcuated tongue extending in an engaging slot 26 defined in the second limb 22 thereof. Therefore, a detailed description of the fastening member 20 will not be repeated herein.

Preferably, a number of recesses 13 are defined in the upper surface of the fin 10a in the compartment 12 and the free end of respective Z-shaped biasing sections 24, 34 of the first and second fastening members 20, 30 are received in associated recesses 13, as shown in FIG. 3, such that the first and second fastening members 20, 30 are retained in position even though they are slightly deformed as being subjected to a force.

In assembly, the fin 10a is firstly placed on top of the integrated circuit chip 50 mounted on the socket 40 with the length direction thereof perpendicular to the sides of the socket 40 where the positioning ears 41 are located. Then, one of the positioning ears 41 is inserted through the engaging slot 26 of the first fastening member 20 and the biasing section 24 is inserted into the compartment 12 from one end thereof. Finally, the biasing section 34 of the second fastening member 30 is inserted into the compartment 12 from the other end thereof and the springing section 33 is pushed downward to cause the engaging slot 36 to engage with the other positioning ears 41 whereby the fin assembly 10 is fastened onto the integrated circuit chip 50.

When the fin assembly 10 needs to be removed, the springing section 33 of the second fastening member 30 is pushed downward to cause the arcuated tongue 37 to contact a inclined surface 42 of the corresponding positioning ear 41 and guide the engaging slot 36 away from the corresponding positioning ear 41 and disengage therefrom. After the second fastening member 30 is unlocked from the corresponding positioning ear 41, the first fastening member 20 can be easily disengaged from its corresponding positioning ear 41 and then the fin assembly 10 can be removed from the chip 50.

According to the above, it is appreciated that the present fin assembly has the following advantages when compared with prior art cooling device:

(1) the fin 10a effectively contacts the integrated circuit chip 50;

(2) the fastening members 20, 30 are made of metal and thus are durable under high temperature working environment;

(3) it is not necessary to detach the integrated circuit chip 50 when mounting the fin assembly;

(4) the fastening members 20, 30 are separate from the fin 10a, and even if the fastening members 20, 30 break, the fin 10a is still usable;

Although the invention has been explained in relation to its preferred embodiment, it is to be understood that many other possible modifications and variations can be made without departing from the spirit and scope of the invention as hereinafter claimed.

I claim:

1. A fin assembly for dissipating heat generated by an integrated circuit chip mounted on a socket having a pair of positioning ears disposed at two opposite sides thereof, the fin assembly comprising:

a fin including a bottom surface for contacting an upper surface of an integrated circuit and an upper surface from which a plurality of ridges extend upward along a length direction thereof, each two adjacent said ridges defining a channel therebetween, in at least one channel, at least one of two associated adjacent said ridges having one extension extending toward the other ridge thereby defining a compartment, the compartment having two opposite ends; and at least one pair of substantially L-shaped fastening members, each of which comprising a first limb and a second limb, for detachably fastening the fin onto the integrated circuit chip, said first limb having a springing section formed adjacent to a joint of the first and second limbs and a flexible biasing section projecting from a free end thereof and extending toward said second limb, said biasing section of respective first limb being inserted into said compartment from the two opposite ends respectively and said biasing section having a height slightly greater than a height of said compartment, said second limb having an engaging slot formed therein adjacent to a free end thereof for cooperating with one of the positioning ears to thereby detachably lock the fin to the socket to ensure reliable surface contact between the integrated circuit and said fin.

2. The fin assembly as claimed in claim 1 wherein said flexible biasing section has a distal end being slightly bent downward, and said upper surface of said fin has a recess in said compartment for receiving said distal end of said biasing section of each of said fastening members.

3. The in assembly as claimed in claim 1 wherein said second limb of each of the fastening members is arcuated outward at the free end thereof to facilitate locking of the engaging slot and the corresponding positioning ear.

4. The fin assembly as claimed in claim 1 wherein said second limb of at least one of the fastening members further comprises an arcuated tongue downwardly and outwardly extending from an upper edge defining the engaging slot for cooperating with an inclined upper face of one of the positioning ears to facilitate unlocking of the engaging slot and the positioning ear.

5. The fin assembly as claimed in claim 1 wherein said springing section of the first limb is a portion of the first limb that inclines from the joint of the first and the second limbs and the height of the second limb is greater than a distance between the upper surface of the fin and the level of the positioning ear.

* * * * *